(12) United States Patent
Tanaka et al.

(10) Patent No.: US 6,936,893 B2
(45) Date of Patent: Aug. 30, 2005

(54) POWER SEMICONDUCTOR DEVICE

(75) Inventors: Masahiro Tanaka, Yokohama (JP);
Shinichi Umekawa, Sagamihara (JP);
Tadashi Matsuda, Yokohama (JP);
Masakazu Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/677,260

(22) Filed: Oct. 3, 2003

(65) Prior Publication Data

US 2004/0238884 A1 Dec. 2, 2004

(30) Foreign Application Priority Data

May 26, 2003 (JP) .................................... 2003-147922

(51) Int. Cl.[7] .............................................. H01L 29/76
(52) U.S. Cl. ...................... 257/341; 257/341; 257/133
(58) Field of Search ................................. 257/341, 133, 257/135, 210, 329, 327, 328, 369, 370

(56) References Cited

U.S. PATENT DOCUMENTS 5,525,824 A * 6/1996 Himi et al. ............... 257/370
5,585,651 A   12/1996 Kitagawa et al.
6,445,048 B1   9/2002 Pfirsch

OTHER PUBLICATIONS

U.S. Appl. No. 10/814,246, filed Apr. 1, 2004, Okuno et al.

* cited by examiner

*Primary Examiner*—David Neims
*Assistant Examiner*—Thinh T Nguyen
(74) *Attorney, Agent, or Firm*—Oblon, Spivak, McClelland, Maier & Neustadt, P.C.

(57) ABSTRACT

The power semiconductor device includes a plurality of trenches disposed in a surface of a semiconductor active layer to reach a first base layer of a first conductivity type. The trenches are disposed at intervals to partition a main cell and a dummy cell. In the main cell, a second base layer of a second conductivity type and an emitter layer of the first conductivity type are disposed. In the dummy cell, a buffer layer of the second conductivity type is disposed. A gate electrode and gate insulating film are disposed in each trench. A partition structure is disposed in the surface of the semiconductor active layer to electrically isolate the buffer layer from the emitter electrode.

20 Claims, 11 Drawing Sheets

PRIOR ART

POWER SEMICONDUCTOR DEVICE

CROSS-REFERENCE TO RELATED APPLICATIONS

This application is based upon and claims the benefit of priority from the prior Japanese Patent Application No. 2003-147922, filed May 26, 2003, the entire contents of which are incorporated herein by reference.

BACKGROUND OF THE INVENTION

1. Field of the Invention

The present invention relates to a power semiconductor device, and particularly to an insulated gate semiconductor device favorably used as a power switching element.

2. Description of the Related Art

In recent years, power supply devices used in the power electronics field are strongly required to be more compact with higher performance. In accordance with this demand, power semiconductor devices have been improved to operate with lower loss and less noise, as well as higher breakdown voltage and larger electric current. Under the circumstances, an improved device (which is referred to as an IEGT (Injection Enhanced Gate Transistor) hereinafter) obtained by improving an IGBT (Insulated Gate Bipolar Transistor) is attracting attention as a device that can reduce the turn-off loss, as well as reducing the ON-state voltage.

As a typical structure of an IEGT, a structure is known in that a dummy cell is disposed between the main cells to reduce the area ratio of the main cells (see, for example, U.S. Pat. No. 5,585,651, and U.S. Pat. No. 6,445,048). According to this structure, since the main cell area is reduced, a restriction is imposed on holes to be injected from the collector side into the n-base layer, and then exhausted to the emitter side through the main cell, in the ON-state of the IEGT. This brings about an increase in injection efficiency of electrons to be injected from the emitter side into the n-base layer. As a consequence, the conductivity modulation of the n-base layer is promoted to achieve a low ON-voltage.

Figure 20:
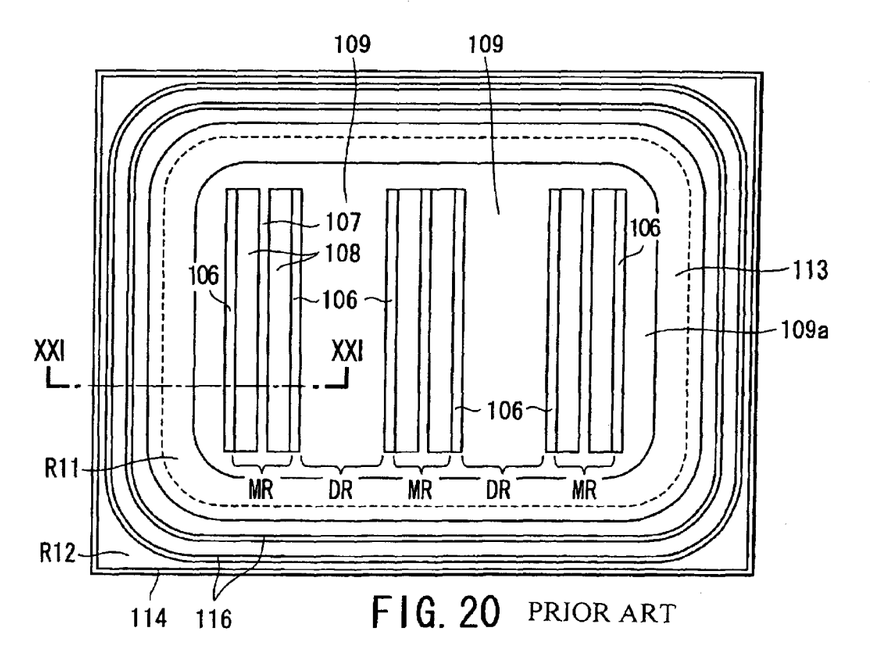
FIG. 20 is a plan view showing the layout of a conventional IEGT chip having dummy cells.
Figure 21:
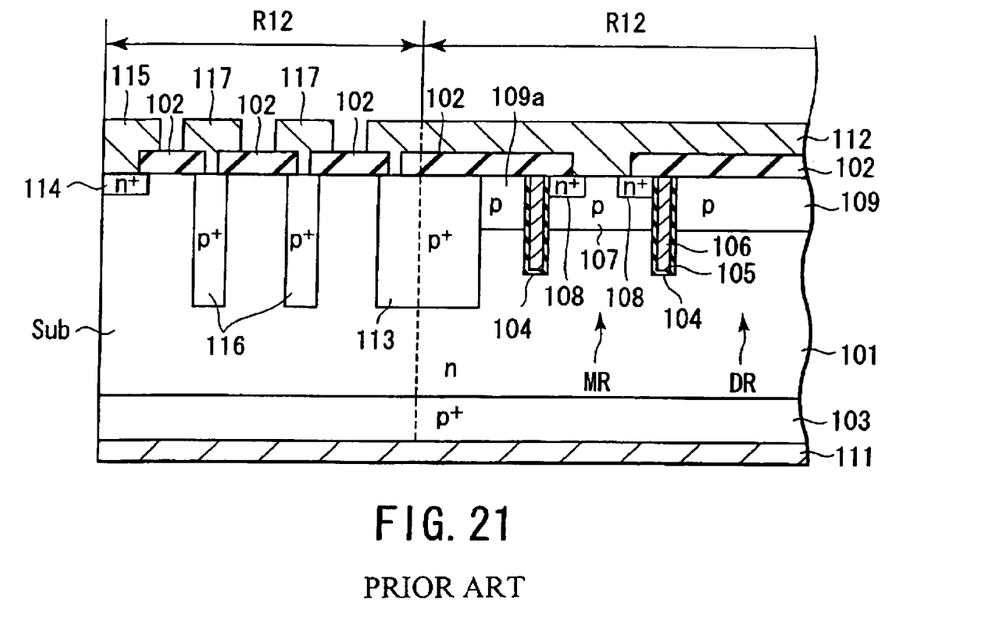
FIG. 21 is a sectional view taken along a line XXI—XXI in FIG. 20, which corresponds to the periphery of the IEGT chip shown in FIG. 20.

FIG. 20 is a plan view showing the layout of a conventional IEGT chip having dummy cells. FIG. 21 is a sectional view taken along a line XXI—XXI in FIG. 20, which corresponds to the periphery of the IEGT chip shown in FIG. 20. As shown in FIGS. 20 and 21, this device has an active region R11 disposed on the central side of a semiconductor substrate (active layer) Sub, and a junction termination region R12 disposed on the periphery of the substrate Sub and surrounding the active region R11. The semiconductor substrate Sub is formed of an n-layer having a high resistivity, and is used as an n-base layer 101.

As shown in FIG. 21, a p-collector layer 103 having a high impurity concentration is disposed on the bottom side of the semiconductor substrate Sub. On the other hand, on the top side of the semiconductor substrate Sub, a plurality of trenches 104 are formed at intervals in the active region R11, such that main cells MR and dummy cells DR are alternately partitioned. In each of the main cells MR, a p-base layer 107 is disposed on the n-base layer 101. N-emitter layers 108 are formed in the surface of the p-base layer 107. In each of the dummy cells DR, a p-buffer layer 109 is disposed on the n-base layer 101. Furthermore, a p-surrounding buffer layer 109a is disposed to surround the main cells MR and dummy cells DR.

A collector electrode 111 is disposed on and in contact with the p-collector layer 103. An emitter electrode 112 is disposed on and in contact with the p-base layer 107 and n-emitter layers 108. An insulating layer 102 is disposed between the emitter electrode 112 and the p-buffer layer 109 in the dummy cells DR. A gate electrode 106 is buried in each of the trenches 104, while it is wrapped in a gate insulating film 105. The gate electrode 106 faces, through the gate insulating film 105, that portion of the p-base layer 107, which is sandwiched between the n-base layer 101 and n-emitter layer 108.

A p-guard ring layer 113 having a high impurity concentration is disposed in the boundary portion between the active region R11 and junction termination region R12, and is electrically connected to the emitter electrode 112. An n-outer ring layer 114 having a high impurity concentration is disposed along the chip edge in the junction termination region R12, and is electrically connected to the collector electrode 111. A plurality of p-field limiting ring layers 116 having a high impurity concentration are disposed between the p-guard ring layer 113 and n-outer ring layer 114. The combination of these layers 113, 114, and 116 contributes to a high breakdown voltage on the top side of the substrate Sub. A stopper electrode 115 and floating electrodes 117 are disposed on and in contact with the n-outer ring layer 114 and p-field limiting ring layers 116, respectively.

In this IEGT, each of the main cells MR forms a narrow current passage connecting the n-base layer 101 to the emitter electrode 112. This arrangement provides an increase in resistance in the ON-state of the IEGT against the flow of holes from the n-base layer 101 into the emitter electrode 112 through the p-base layer 107 in the main cell MR, thereby restricting the holes being exhausted into the emitter electrode 112. As a consequence, the injection efficiency of electrons from the n-emitter layers 108 into the n-base layer 101 improves, thereby promoting conductivity modulation of the n-base layer 101, resulting in a low ON-voltage.

As described later, according to research conducted by the present inventors, it has been found that conventional IEGTs have insufficient points to lower the ON-voltage. In light of the problems of the conventional technique, there are demands for a power semiconductor device that has a high current-carrying ability in the ON-state to make the ON-voltage lowered.

BRIEF SUMMARY OF THE INVENTION

According to a first aspect of the present invention, there is provided a power semiconductor device comprising:

a semiconductor active layer;

a first base layer of a first conductivity type disposed in the active layer;

a plurality of trenches disposed in a surface of the active layer at intervals to partition a main cell and a dummy cell, and to reach the first base layer;

a collector layer of a second conductivity type disposed on the first base layer, at a position remote from the trenches;

a second base layer of the second conductivity type disposed in the main cell and on the first base layer;

an emitter layer of the first conductivity type disposed on the second base layer;

a buffer layer of the second conductivity type disposed in the dummy cell and on the first base layer;

a gate electrode disposed in each trench to face, through a gate insulating film, a portion of the second base layer sandwiched between the first base layer and the emitter layer;

a collector electrode disposed on the collector layer;

an emitter electrode disposed on the second base layer and the emitter layer; and a partition structure disposed in the surface of the active layer to electrically isolate the buffer layer from the emitter electrode.

According to a second aspect of the present invention, there is provided a power semiconductor device including an active region and a junction termination region surrounding the active region, comprising:

a semiconductor active layer common to the active region and the junction termination region, the active layer having first and second main surfaces on opposite sides;

a first base layer of a first conductivity type disposed in the active layer over the active region and the junction termination region;

a plurality of trenches disposed within the active region and in the first main surface of the active layer at intervals to partition a main cell and a dummy cell, and to reach the first base layer;

a collector layer of a second conductivity type disposed within the active region and on the first base layer on the second main surface side of the active layer;

a second base layer of the second conductivity type disposed in the main cell and on the first base layer;

an emitter layer of the first conductivity type disposed on the second base layer;

a buffer layer of the second conductivity type disposed in the dummy cell and on the first base layer;

a gate electrode disposed in each trench to face, through a gate insulating film, a portion of the second base layer sandwiched between the first base layer and the emitter layer;

a collector electrode disposed on the collector layer;

an emitter electrode disposed on the second base layer and the emitter layer;

a guard ring layer of the second conductivity type disposed at a boundary portion between the active region and the junction termination region to surround the active region, the guard ring layer being formed in the first main surface of the active layer and electrically connected to the emitter electrode; and a partition structure disposed in the first main surface of the active layer to electrically isolate the buffer layer from the emitter electrode, wherein the partition structure includes a first isolating section that intervenes between the p-buffer layer and the second base layer to electrically isolate them from each other, and a second isolating section that intervenes between the p-buffer layer and the guard ring layer to electrically isolate them from each other.

DETAILED DESCRIPTION OF THE INVENTION

In the process of developing the present invention, the inventors conducted research on the conventional IEGT shown in FIGS. 20 and 21, and so forth. As a result, the inventors have arrived at the findings given below.

In the conventional IEGT, the p-base layer 107 in each main cell MR, the p-buffer layer 109 in each dummy cell DR, and p-surrounding buffer layer 109a surrounding them are integrally formed, and are electrically connected to each other at portions around the active region R11. Accordingly, the p-buffer layer 109 in each dummy cell DR is electrically connected to the emitter electrode 112, although through a high interconnection resistance due to the bulk of the semiconductor substrate. According to this arrangement, when the IEGT is turned off, holes in the n-base layer 101 are released into the emitter electrode 112 through the p-buffer layer 109 in each dummy cell DR, thereby increasing the turn-off speed.

On the other hand, in the ON-state of the IEGT, the potential of the p-buffer layer 109 in each dummy cell DR is lowered due to an influence of the emitter electrode 112, although slightly. The potential of each dummy cell DR thus lowered attracts holes injected from the p-collector layer 103 into the n-base layer 101, thereby dispersing the holes. As a consequence, the level of concentration of holes in the upper portion of the n-base layer 101 in each main cell MR decreases, thereby lowering the injection efficiency of electrons from the n-emitter layers 108 into the n-base layer 101.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary. In the following embodiments, the first conductivity type is n-type, and the second conductivity type is p-type.

(First Embodiment)

Figure 1:
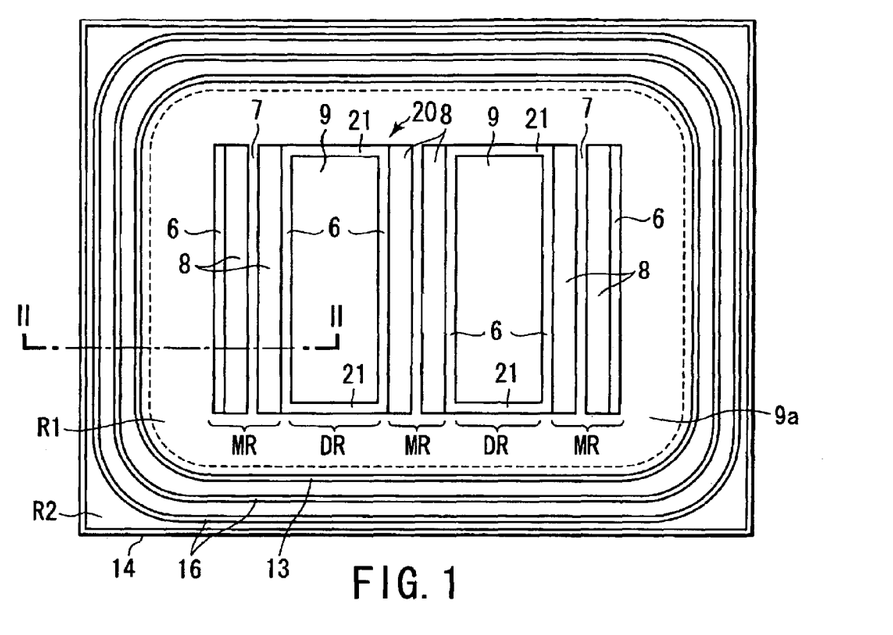
FIG. 1 is a plan view showing the layout of a power semiconductor device (IEGT chip) according to a first embodiment of the present invention.
Figure 2:
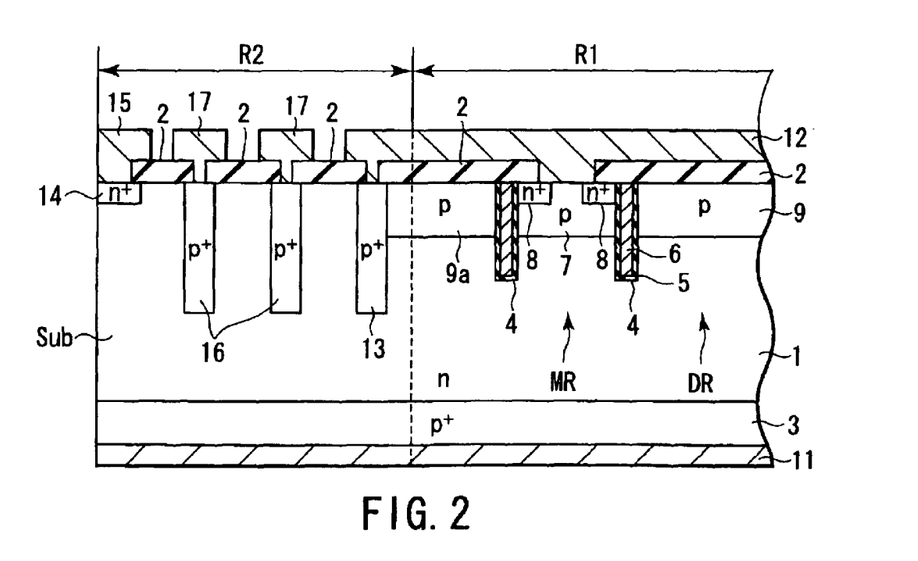
FIG. 2 is a sectional view taken along line II—II in FIG. 1, which corresponds to the periphery of the IEGT chip shown in FIG. 1.

FIG. 1 is a plan view showing the layout of a power semiconductor device (IEGT chip) according to a first embodiment of the present invention. FIG. 2 is a sectional view taken along line II—II in FIG. 1, which corresponds to the periphery of the IEGT chip shown in FIG. 1. As shown in FIGS. 1 and 2, this device has an active region R1 disposed on the central side of a semiconductor substrate (active layer) Sub, and a junction termination region R2 disposed on the periphery of the substrate Sub and surrounding the active region R1. The semiconductor substrate Sub is formed of an n-layer having a high resistivity, and is used as an n-base layer 1 extending over the active region R1 and junction termination region R2.

As shown in FIG. 2, on the bottom side of the semiconductor substrate Sub, a p-collector layer 3 having a high impurity concentration is disposed on the n-base layer 1 having a high resistivity, over the active region R1 and junction termination region R2. An n-buffer layer having a high impurity concentration may be disposed between the n-base layer 1 and p-collector layer 3. On the other hand, on the top side of the semiconductor substrate Sub, a plurality of trenches 4 are formed at intervals in the active region R1, such that main cells MR and dummy cells DR are alternately partitioned. The trenches 4 have a depth reaching from the surface of the substrate Sub into the n-base layer 1. In each of the main cells MR, a p-base layer 7 shallower than the trenches 4 is disposed on the n-base layer 1. N-emitter layers 8 are formed in the surface of the p-base layer 7. In each of the dummy cells DR, a p-buffer layer 9 shallower than the trenches 4 is disposed on the n-base layer 1. Furthermore, a p-surrounding buffer layer 9a shallower than the trenches 4 is disposed to surround the main cells MR and dummy cells DR. The p-base layers 7, p-buffer layers 9, and p-surrounding buffer layer 9a are formed from a p-common layer divided by the trenches 4. Theses layers 7, 9, and 9a may be formed independently of each other.

A collector electrode 11 is disposed on and in contact with the p-collector layer 3. An emitter electrode 12 is disposed on and in contact with the p-base layer 7 and n-emitter layers 8. An insulating layer 2 is disposed between the emitter electrode 12 and the p-buffer layer 9 in each dummy cell DR. A p-contact layer having a high impurity concentration may be formed in the p-base layer 7 and in contact with the emitter electrode 12.

A gate electrode 6 is buried in each trench 4, while it is wrapped in a gate insulating film 5. Where the main cells MR and dummy cells DR are not alternately disposed, only the trench 4 adjacent to each main cell MR may be provided with a gate electrode 6 buried therein. The gate electrode 6 faces, through the gate insulating film 5, that portion of the p-base layer 7, which is sandwiched between the n-base layer 1 and n-emitter layer 8. As a consequence, an n-channel MOSFET is formed in each main cell MR, such that it selectively connects the corresponding n-emitter layer 8 to the n-base layer 1, using the p-base layer 7 as a channel region, to inject electrons. On the other hand, the dummy cells DR are not provided with such an n-channel MOSFET.

A p-guard ring layer 13 having a high impurity concentration is formed in the top surface of the semiconductor substrate Sub, within the boundary portion between the active region R1 and junction termination region R2. The p-guard ring layer 13 is deeper than the trenches 4 and surrounds the active region R1. The p-guard ring layer 13 is electrically connected to the p-surrounding buffer layer 9a, which is shallower than p-guard ring layer 13 and surrounds the main cells MR and dummy cells DR on the inner side of the p-guard ring layer 13. The p-guard ring layer 13 is in contact with the end portion of the emitter electrode 12, and thus is electrically connected to the emitter electrode 12.

An n-outer ring layer 14 having a high impurity concentration is formed in the top surface of the semiconductor substrate Sub, along the chip edge in the junction termination region R2. A ring-like stopper electrode 15 is disposed on and in contact with the n-outer ring layer 14. The n-outer ring layer 14 and stopper electrode 15 have electrical conduction to the collector electrode 11 through the side surface of the substrate Sub. The combination of the p-guard ring layer 13 and n-outer ring layer 14 contributes to a high breakdown voltage on the top side of the substrate Sub.

A plurality of p-field limiting ring layers 16 having a high impurity concentration are formed in the top surface of the semiconductor substrate Sub, between the p-guard ring layer 13 and n-outer ring layer 14. The p-field limiting ring layers 16 are deeper than the trenches 4 and surround the active region R1. Ring electrodes 17 are disposed on and in contact with the p-field limiting ring layers 16, and are set in a floating state. The p-field limiting ring layers 16 have the function of laterally extending an equi-potential surface in the OFF-state, thereby relaxing electric field concentration to further improve the breakdown voltage.

In this embodiment, the p-guard ring layer 13 and p-field limiting ring layers 16 are formed in the same step and have the same impurity concentration and the same depth. These layers 13 and 16, however, may have different impurity concentrations and/or different depths. In place of the p-field limiting ring layers 16, a p-RESURF layer may be formed in the top surface of the substrate Sub.

In each dummy cell DR, the top surface of the p-buffer layer 9 is electrically isolated from the emitter electrode 12 by the insulating layer 2. Furthermore, the side surfaces of the p-buffer layer 9 at the opposite ends of the trenches 4 are electrically isolated from the emitter electrode 12 by a partition structure 20 disposed in the top surface of the semiconductor substrate Sub. The partition structure 20 includes a first isolating section that intervenes between the p-buffer layer 9 and the p-base layer 7 in each main cell MR to electrically isolate them from each other, and a second isolating section that intervenes between the p-buffer layer 9 and p-guard ring layer 13 to electrically isolate them from each other.

In this embodiment, the first and second isolating sections are formed of common walls (partition walls) comprising dummy cell end walls (partition walls), which bridge the ends of the trenches 4 one on either end of each dummy cell DR and cooperate with the trenches 4 to surround the dummy cell DR. The dummy cell end walls are formed of dummy cell end trenches (partition trenches) 21, which are formed in the top surface of the semiconductor substrate Sub, in the same step and the same depth as the trenches 4.

An insulating film and a conductive layer wrapped therein are buried in each dummy cell end trench 21, which are formed in the same step and the same material as the gate insulating film 5 and gate electrode 6 in each trench 4, respectively. The conductive layer in each dummy cell end trench 21 is electrically connected to the gate electrode 6. Each dummy cell end trench 21 may be filled with an insulating layer, as described later.

The IEGT according to this embodiment can attain a low ON-voltage almost the same as that of a thyristor, if the depth, width, interval, and the like of the trenches 4 are suitably designed. This is given by the dummy cells DR that bring about resistance against hole current injected from the p-collector layer 3, as follows. Specifically, the dummy cells DR provide a lateral resistance of the n-base layer 1, and each of the main cells MR forms a current passage connecting the n-base layer 1 to the emitter electrode 12, which is narrow enough to generate a resistance.

This arrangement provides an increase in resistance in the ON-state of the IEGT against the flow of holes from the p-collector layer 3 into the emitter electrode 12 through the n-base layer 1 and p-base layer 7 in each main cell MR, thereby restricting the holes being exhausted into the emitter electrode 12. As a consequence, the injection efficiency of electrons from the n-emitter layers 8 into the n-base layer 1 improves, thereby promoting conductivity modulation of the n-base layer 1, resulting in a low ON-voltage.

Furthermore, the p-buffer layer 9 in each dummy cell DR is completely electrically isolated from the emitter electrode 12 by the dummy cell end trenches 21 formed integrally with the trenches 4. Accordingly, in the ON-state of the IEGT, holes injected from the p-collector layer 103 into the n-base layer 101 are not attracted or dispersed by the potential of each dummy cell DR, but are concentrated in the upper portion of the n-base layer 1 in each main cell MR. As a consequence, the injection efficiency of electrons from the n-emitter layers 8 into the n-base layer 1 further improves, thereby resulting in a still lower ON-voltage.

(Second Embodiment)

Figure 3:
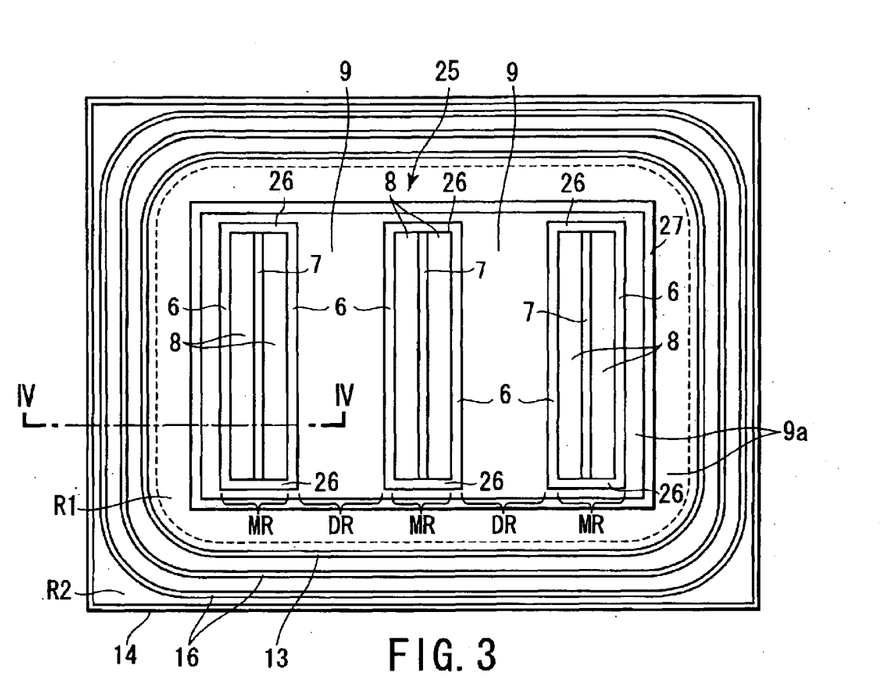
FIG. 3 is a plan view showing the layout of a power semiconductor device (IEGT chip) according to a second embodiment of the present invention.
Figure 4:
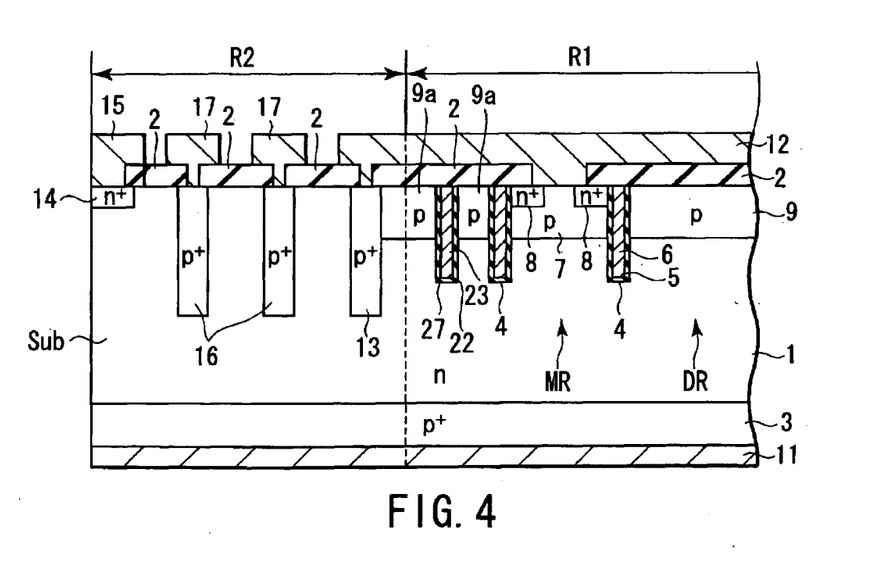
FIG. 4 is a sectional view taken along line IV—IV in FIG. 3, which corresponds to the periphery of the IEGT chip shown in FIG. 3.

FIG. 3 is a plan view showing the layout of a power semiconductor device (IEGT chip) according to a second embodiment of the present invention. FIG. 4 is a sectional view taken along line IV—IV in FIG. 3, which corresponds to the periphery of the IEGT chip shown in FIG. 3. As shown in FIGS. 3 and 4, this embodiment has a partition structure 25 different from the partition structure 20 according to the first embodiment shown in FIGS. 1 and 2, for electrically isolating a p-buffer layer 9 in each dummy cell DR from an emitter electrode 12.

In each dummy cell DR, the top surface of the p-buffer layer 9 is electrically isolated from the emitter electrode 12 by an insulating layer 2. Furthermore, the side surfaces of the p-buffer layer 9 are electrically isolated from the emitter electrode 12 by the partition structure 25 disposed in the top surface of a semiconductor substrate Sub.

The partition structure 25 includes a first isolating section that electrically isolates the p-buffer layer 9 from a p-base layer 7. The first isolating section comprises main cell end walls (partition walls), which bridge the ends of the trenches 4 one on either end of each main cell MR and cooperate with the trenches 4 to surround the main cell MR. The partition structure 25 also includes a second isolating section that electrically isolates the p-buffer layer 9 from a p-guard ring layer 13. The second isolating section comprises a surrounding wall (partition wall), which penetrates and divides a shallow p-surrounding buffer layer 9a and surrounds the main cells MR and dummy cells DR. The main cell end walls and surrounding wall are formed of main cell end trenches (partition trenches) 26 and a surrounding trench (partition trench) 27, respectively, which are formed in the top surface of the semiconductor substrate Sub, in the same step and the same depth as the trenches 4.

An insulating film 22 and a conductive layer 23 wrapped therein are buried in each of the main cell end trenches 26 and surrounding trench 27, which are formed in the same step and the same material as the gate insulating film 5 and gate electrode 6 in each trench 4, respectively. The conductive layer 23 is electrically connected to the gate electrode 6. Each of the main cell end trenches 26 and surrounding trench 27 may be filled with an insulating layer, as described later.

In the IEGT according to this embodiment, the p-buffer layer 9 in each dummy cell DR is completely electrically isolated from the emitter electrode 12 by the main cell end trenches 26 formed integrally with the trenches 4, and the surrounding trench 27 surrounding the main cells MR and dummy cells DR. As a consequence, also in this embodiment, the injection efficiency of electrons from n-emitter layers 8 into an n-base layer 1 further improves, thereby resulting in a still lower ON-voltage, as in the first embodiment.

(Third Embodiment)

Figure 5:
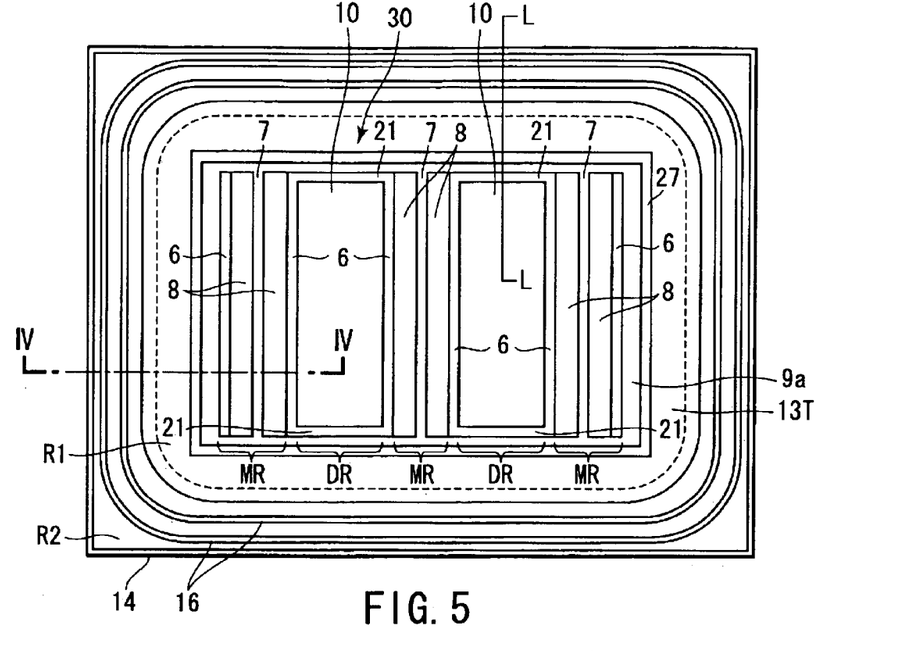
FIG. 5 is a plan view showing the layout of a power semiconductor device (IEGT chip) according to a third embodiment of the present invention.
Figure 6:
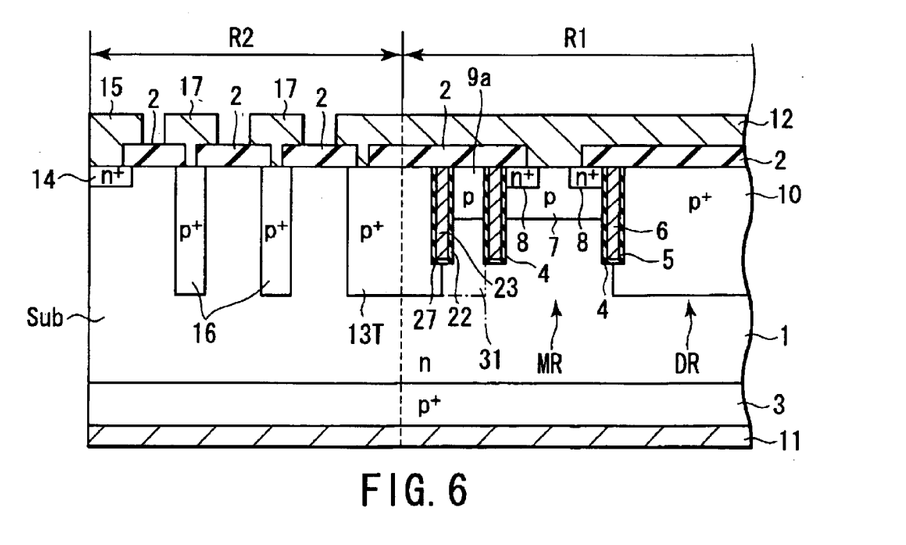
FIG. 6 is a sectional view taken along line VI—VI in FIG. 5, which corresponds to the periphery of the IEGT chip shown in FIG. 5.

FIG. 5 is a plan view showing the layout of a power semiconductor device (IEGT chip) according to a third embodiment of the present invention. FIG. 6 is a sectional view taken along line VI—VI in FIG. 5, which corresponds to the periphery of the IEGT chip shown in FIG. 5. As shown in FIGS. 5 and 6, in this embodiment, a p-buffer layer 10 having a high impurity concentration and deeper than trenches 4 is formed in each dummy cell DR. Furthermore, a p-guard ring layer 13T having a high impurity concentration, deeper than the trenches 4, and having a large width to extend into the active region R1, is formed in the boundary portion between the active region R1 and junction termination region R2. A shallow p-surrounding buffer layer 9a is disposed between the p-buffer layer 10 and p-guard ring layer 13T. In this embodiment, the p-buffer layer 10 and p-guard ring layer 13T are formed in the same step and have the same impurity concentration and the same depth. The layers 10 and 13T, however, may have different impurity concentrations and different depths.

In each dummy cell DR, the top surface of the p-buffer layer 10 is electrically isolated from an emitter electrode 12 by an insulating layer 2. Furthermore, the side surfaces of the p-buffer layer 10 are electrically isolated from the emitter electrode 12 by a partition structure 30 disposed in the top surface of a semiconductor substrate Sub. The partition structure 30 includes a first isolating section that electrically isolates the p-buffer layer 10 from a p-base layer 7. The first isolating section comprises dummy cell end walls (partition walls), which bridge the ends of the trenches 4 one on either end of each dummy cell DR and cooperate with the trenches 4 to surround the dummy cell DR. The dummy cell end walls are formed of dummy cell end trenches 21, as explained in the first embodiment.

The partition structure 30 also includes a second isolating section that electrically isolates the p-buffer layer 10 from the p-guard ring layer 13T. The second isolating section comprises a surrounding wall (partition wall), which surrounds the main cells MR and dummy cells DR along the inner side of the p-guard ring layer 13T. The surrounding wall is formed of a combination of a surrounding trench 27, as explained in the second embodiment, and an n-surrounding layer (partition layer) 31 disposed in the semiconductor substrate Sub at a position deeper than the surrounding trench 27. The surrounding trench 27 is disposed between the p-surrounding buffer layer 9a and p-guard ring layer 13T, which surround the main cells MR and dummy cells DR. The n-surrounding layer 31 is a portion integral with an n-base layer (i.e., the ground material of the semiconductor substrate Sub), which is present below the shallow p-surrounding buffer layer 9a.

In this embodiment, the p-buffer layers 10 and p-guard ring layer 13T are deeper than the dummy cell end trenches 21 and surrounding trench 27. In this case, the p-buffer layers 10 cannot be electrically isolated from the p-guard ring layer 13T only by the dummy cell end trenches 21 and surrounding trench 27 in a line L-L direction in FIG. 5. Accordingly, the surrounding trench 27 is combined with the n-surrounding layer 31 disposed at a position deeper than the surrounding trench 27 to form a surrounding wall that electrically isolates the p-buffer layer 10 from the p-guard ring layer 13T.

In the IEGT according to this embodiment, the p-buffer layer 10 in each dummy cell DR is completely electrically isolated from the emitter electrode 12 by the dummy cell end trenches 21 formed integrally with the trenches 4, and the surrounding trench 27 and n-surrounding layer 31 surrounding the main cells MR and dummy cells DR. As a consequence, also in this embodiment, the injection efficiency of electrons from n-emitter layers 8 into an n-base layer 1 further improves, thereby resulting in a still lower ON-voltage, as in the first embodiment.

(Fourth Embodiment)

Figure 7:
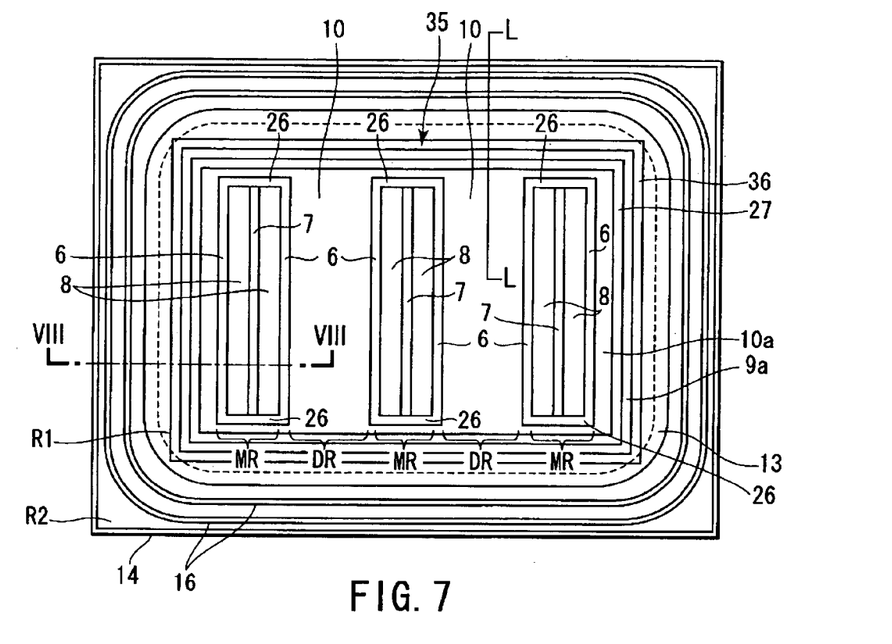
FIG. 7 is a plan view showing the layout of a power semiconductor device (IEGT chip) according to a fourth embodiment of the present invention.
Figure 8:
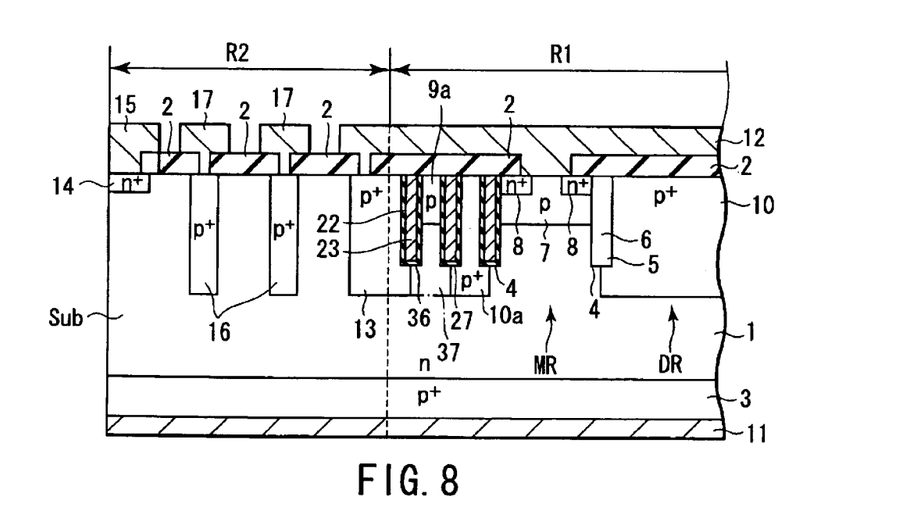
FIG. 8 is a sectional view taken along line VIII—VIII in FIG. 7, which corresponds to the periphery of the IEGT chip shown in FIG. 7.

FIG. 7 is a plan view showing the layout of a power semiconductor device (IEGT chip) according to a fourth embodiment of the present invention. FIG. 8 is a sectional view taken along line VIII—VIII in FIG. 7, which corresponds to the periphery of the IEGT chip shown in FIG. 7. As shown in FIGS. 7 and 8, also in this embodiment, a p-buffer layer 10 having a high impurity concentration and deeper than trenches 4 is formed in each dummy cell DR. Furthermore, a p-inner surrounding layer 10a having a high impurity concentration and deeper than the trenches 4 is formed around the main cells MR and dummy cells DR. The p-inner surrounding layer 10a is a layer formed integrally with the p-buffer layer 10 in each dummy cell DR and electrically connected thereto. A shallow p-surrounding buffer layer 9a is formed between the p-inner surrounding layer 10a and p-guard ring layer 13.

The top surface of the p-buffer layer 10 in each dummy cell DR and the top surface of the p-inner surrounding layer 10a disposed therearound are electrically isolated from an emitter electrode 12 by an insulating layer 2. Furthermore, the side surfaces of the p-buffer layer 10 and p-inner surrounding layer 10a are electrically isolated from the emitter electrode 12 by a partition structure 35 disposed in the top surface of a semiconductor substrate Sub. The partition structure 35 includes a first isolating section that electrically isolates the p-buffer layer 10 from a p-base layer 7. The first isolating section comprises main cell end walls (partition walls), which bridge the ends of the trenches 4 one on either end of each main cell MR and cooperate with the trenches 4 to surround the main cell MR. The main cell end walls are formed of main cell end trenches 26, as explained in the second embodiment.

The partition structure 35 also includes a second isolating section that electrically isolates the p-inner surrounding layer 10a electrically connected to the p-buffer layer 10 from a p-guard ring layer 13. The second isolating section comprises a surrounding wall (partition wall) disposed between the p-inner surrounding layer 10a and p-guard ring layer 13. The surrounding wall is formed of a combination of a surrounding trench 27, as explained in the second embodiment, a second surrounding trench (partition trench) 36 having the same inner structure as the surrounding trench 27 and disposed coaxially with and on the outer side of the surrounding trench 27, and an n-surrounding layer (partition layer) 37 disposed in the semiconductor substrate Sub at a position between the surrounding trenches 27 and 36 and deeper than them. The surrounding trenches 27 and 36 are disposed to sandwich a shallow p-surrounding buffer layer 9a, which surrounds the main cells MR and dummy cells DR. The n-surrounding layer 37 is a portion integral with an n-base layer (i.e., the ground material of the semiconductor substrate Sub), which is present below the shallow p-surrounding buffer layer 9a.

In this embodiment, the p-guard ring layer 13 and the p-inner surrounding layer 10a electrically connected to the p-buffer layers 10 are deeper than the surrounding trenches 27 and 36. In this case, the p-inner surrounding layer 10a cannot be electrically isolated from the p-guard ring layer 13 only by the surrounding trenches 27 and 36 in a line L-L direction in FIG. 7. Accordingly, the surrounding trenches 27 and 36 are combined with the n-surrounding layer 37 disposed at a position deeper than the surrounding trenches 27 and 36 to form a surrounding wall that electrically isolates the p-inner surrounding layer 10a from the p-guard ring layer 13.

In the IEGT according to this embodiment, the p-buffer layer 10 in each dummy cell DR and the p-inner surrounding layer 10a electrically connected thereto are completely electrically isolated from the emitter electrode 12 by the main cell end trenches 26 formed integrally with the trenches 4, and the surrounding trenches 27 and 36 and n-surrounding layer 37 surrounding the main cells MR and dummy cells DR. As a consequence, also in this embodiment, the injection efficiency of electrons from n-emitter layers 8 into an n-base layer 1 further improves, thereby resulting in a still lower ON-voltage, as in the first embodiment.

Figure 9:
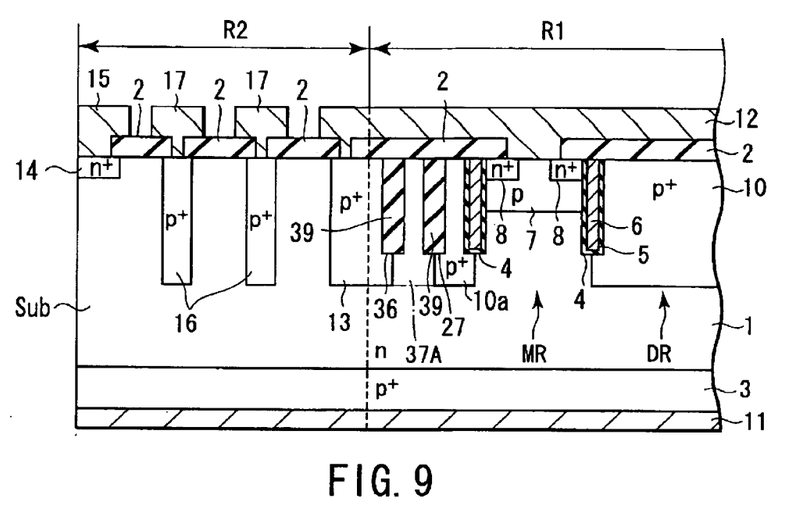
FIG. 9 is a sectional view showing the periphery of a power semiconductor device (IEGT chip) according to a modification of the fourth embodiment of the present invention.

FIG. 9 is a sectional view showing the periphery of a power semiconductor device (IEGT chip) according to a modification of the fourth embodiment of the present invention. As shown in FIG. 9, in this modification, the portion between the surrounding trenches 27 and 36 is not provided with the shallow p-surrounding buffer layer 9a, but with an n-surrounding layer (partition layer) 37A reaching the surface of the semiconductor substrate Sub. Furthermore, the surrounding trenches 27 and 36 are not provided with the same structure as the gate insulating film 5 and gate electrode 6, but with an insulating layer 39 buried therein. According to this modification, the p-buffer layer 10 in each dummy cell DR can be more reliably electrically isolated from the emitter electrode 12.

(Fifth Embodiment)

Figure 10:
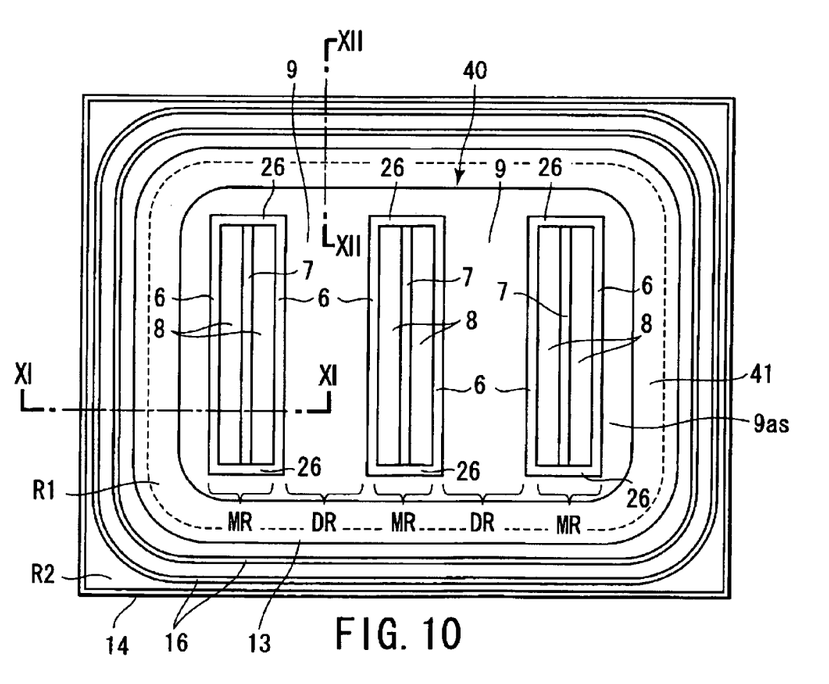
FIG. 10 is a plan view showing the layout of a power semiconductor device (IEGT chip) according to a fifth embodiment of the present invention.
Figure 11:
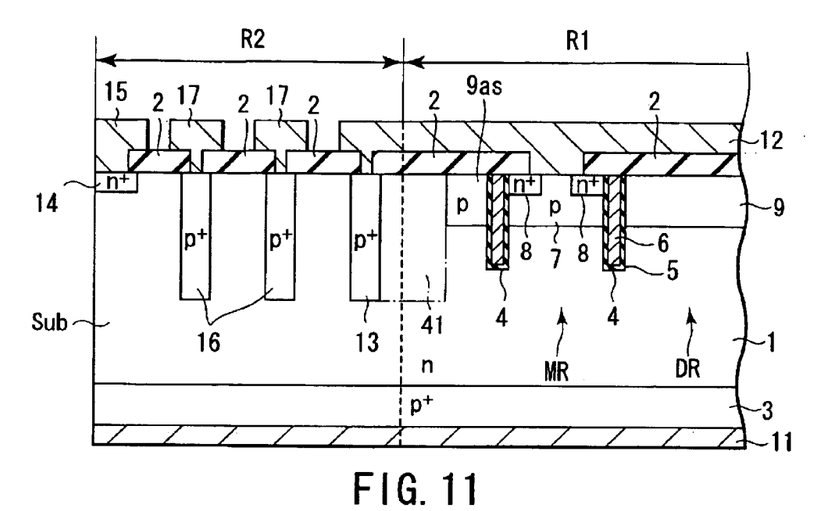
FIG. 11 is a sectional view taken along line XI—XI in FIG. 10, which corresponds to the periphery of the IEGT chip shown in FIG. 10.
Figure 12:
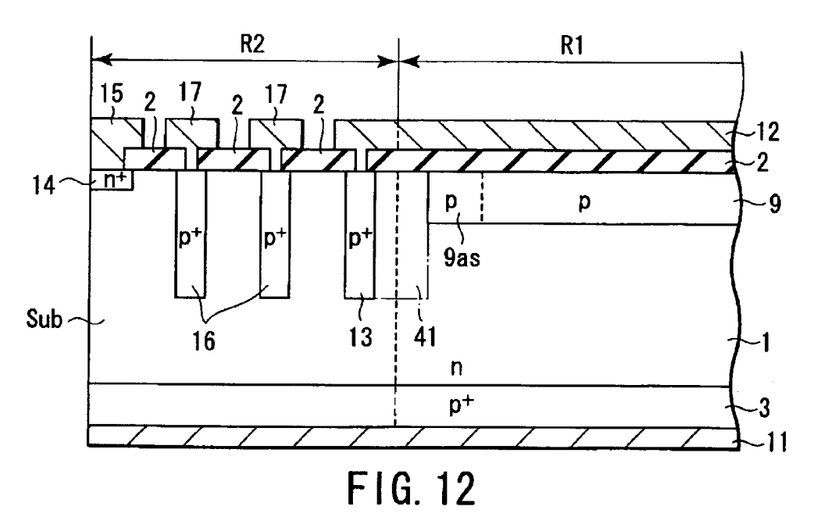
FIG. 12 is a sectional view taken along line XII—XII in FIG. 10, which corresponds to the periphery of the IEGT chip shown in FIG. 10.

FIG. 10 is a plan view showing the layout of a power semiconductor device (IEGT chip) according to a fifth embodiment of the present invention. FIGS. 11 and 12 are sectional views taken along lines XI—XI and XII—XII, respectively, in FIG. 10, which correspond to the periphery of the IEGT chip shown in FIG. 10. As shown in FIGS. 10 to 12, this embodiment differs from the second embodiment shown in FIGS. 3 and 4, in that it does not include the surrounding trench 27 surrounding the main cells MR and dummy cells DR, but includes a shallow p-surrounding buffer layer 9as formed to terminate before reaching a p-guard ring layer 13 which is thus out of contact with the p-guard ring layer 13. In this embodiment with such a structure, a p-buffer layer 9 in each dummy cell DR is electrically isolated from an emitter electrode 12 in a manner described below.

In each dummy cell DR, the top surface of the p-buffer layer 9 is electrically isolated from the emitter electrode 12 by an insulating layer 2. Furthermore, the side surfaces of the p-buffer layer 9 are electrically isolated from the emitter electrode 12 by a partition structure 40 disposed in the top surface of a semiconductor substrate Sub. The partition structure 40 includes a first isolating section that electrically isolates the p-buffer layer 9 from a p-base layer 7. The first isolating section comprises main cell end walls (partition walls), which bridge the ends of the trenches 4 one on either end of each main cell MR and cooperate with the trenches 4 to surround the main cell MR. The main cell end walls are formed of main cell end trenches 26, as explained in the second embodiment.

The partition structure 40 also includes a second isolating section that electrically isolates the p-buffer layer 9 from a p-guard ring layer 13. The second isolating section comprises a surrounding wall (partition wall), which surrounds the main cells MR and dummy cells DR along the inner side of the p-guard ring layer 13. The surrounding wall is formed of an n-surrounding layer (partition layer) 41 disposed in the surface of the semiconductor substrate Sub between the p-surrounding buffer layer 9as and p-guard ring layer 13. The n-surrounding layer 41 is a portion integral with an n-base layer (i.e., the ground material of the semiconductor substrate Sub), which is left by termination of the p-surrounding buffer layer 9as before reaching the p-guard ring layer 13.

In the IEGT according to this embodiment, the p-buffer layer 9 in each dummy cell DR is completely electrically isolated from the emitter electrode 12 by the main cell end trenches 26 formed integrally with the trenches 4, and the n-surrounding layer 41 surrounding the main cells MR and dummy cells DR. As a consequence, also in this embodiment, the injection efficiency of electrons from n-emitter layers 8 into an n-base layer 1 further improves, thereby resulting in a still lower ON-voltage, as in the first embodiment.

(Sixth Embodiment)

Figure 13:
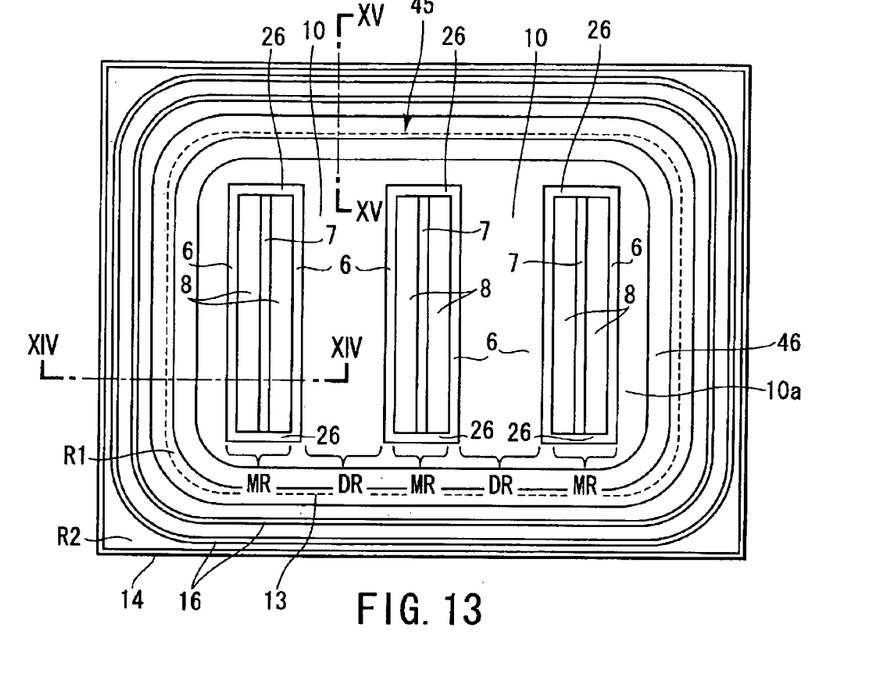
FIG. 13 is a plan view showing the layout of a power semiconductor device (IEGT chip) according to a sixth embodiment of the present invention.
Figure 14:
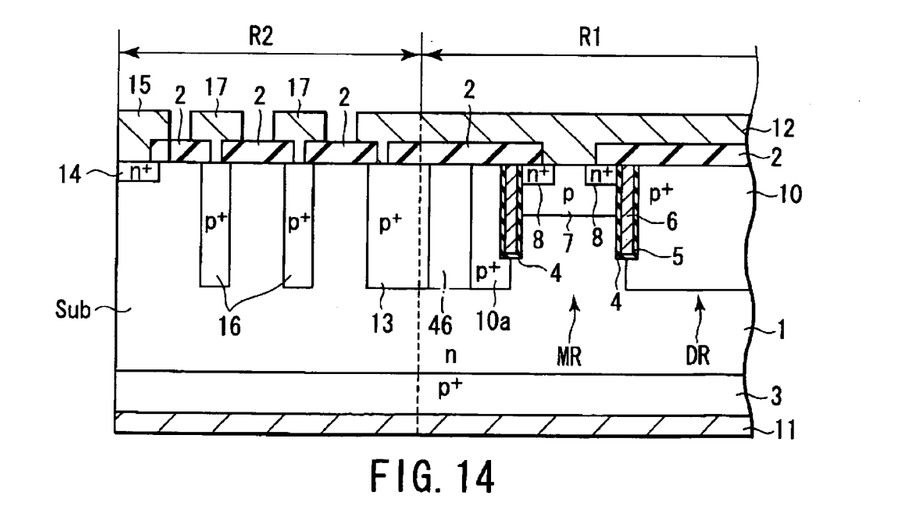
FIG. 14 is a sectional view taken along line XIV—XIV in FIG. 13, which corresponds to the periphery of the IEGT chip shown in FIG. 13.
Figure 15:
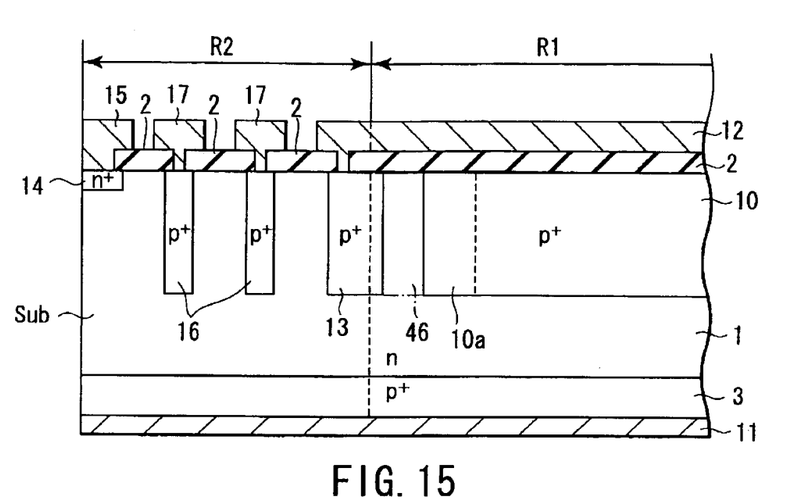
FIG. 15 is a sectional view taken along line XV—XV in FIG. 13, which corresponds to the periphery of the IEGT chip shown in FIG. 13.

FIG. 13 is a plan view showing the layout of a power semiconductor device (IEGT chip) according to a sixth embodiment of the present invention. FIGS. 14 and 15 are sectional views taken along lines XIV—XIV and XV—XV in FIG. 13, which correspond to the periphery of the IEGT chip shown in FIG. 13. As shown in FIGS. 13 to 15, this embodiment differs from the fourth embodiment shown in FIGS. 7 and 8, in that it does not include any of the two surrounding trenches 27 and 36, and shallow p-surrounding buffer layer 9a disposed therebetween, which surround the main cells MR and dummy cells DR. In this embodiment with such a structure, a p-buffer layer 10 in each dummy cell DR is electrically isolated from an emitter electrode 12 in a manner described below.

The top surface of the p-buffer layer 10 in each dummy cell DR and the top surface of the p-inner surrounding layer 10a disposed therearound are electrically isolated from an emitter electrode 12 by an insulating layer 2. Furthermore, the side surfaces of the p-buffer layer 10 and p-inner surrounding layer 10a are electrically isolated from the emitter electrode 12 by a partition structure 45 disposed in the top surface of a semiconductor substrate Sub. The partition structure 45 includes a first isolating section that electrically isolates the p-buffer layer 10 from a p-base layer 7. The first isolating section comprises main cell end walls (partition walls), which bridge the ends of the trenches 4 one on either end of each main cell MR and cooperate with the trenches 4 to surround the main cell MR. The main cell end walls are formed of main cell end trenches 26, as explained in the second embodiment.

The partition structure 45 also includes a second isolating section that electrically isolates the p-inner surrounding layer 10a electrically connected to the p-buffer layer 10 from a p-guard ring layer 13. The second isolating section comprises a surrounding wall (partition wall) disposed between the p-inner surrounding layer 10a and p-guard ring layer 13. The surrounding wall is formed of an n-surrounding layer (partition layer) 46 disposed in the surface of the semiconductor substrate Sub between the p-inner surrounding layer 10a and p-guard ring layer 13. The n-surrounding layer 46 is a portion integral with an n-base layer (i.e., the ground material of the semiconductor substrate Sub), which is left by excluding the shallow p-surrounding buffer layer 9a.

In the IEGT according to this embodiment, the p-buffer layer 10 in each dummy cell DR and the p-inner surrounding layer 10a electrically connected thereto are completely electrically isolated from the emitter electrode 12 by the main cell end trenches 26 formed integrally with the trenches 4, and the n-surrounding layer 46 surrounding the main cells MR and dummy cells DR. As a consequence, also in this embodiment, the injection efficiency of electrons from n-emitter layers 8 into an n-base layer 1 further improves, thereby resulting in a still lower ON-voltage, as in the first embodiment.

(Seventh Embodiment)

Figure 16:
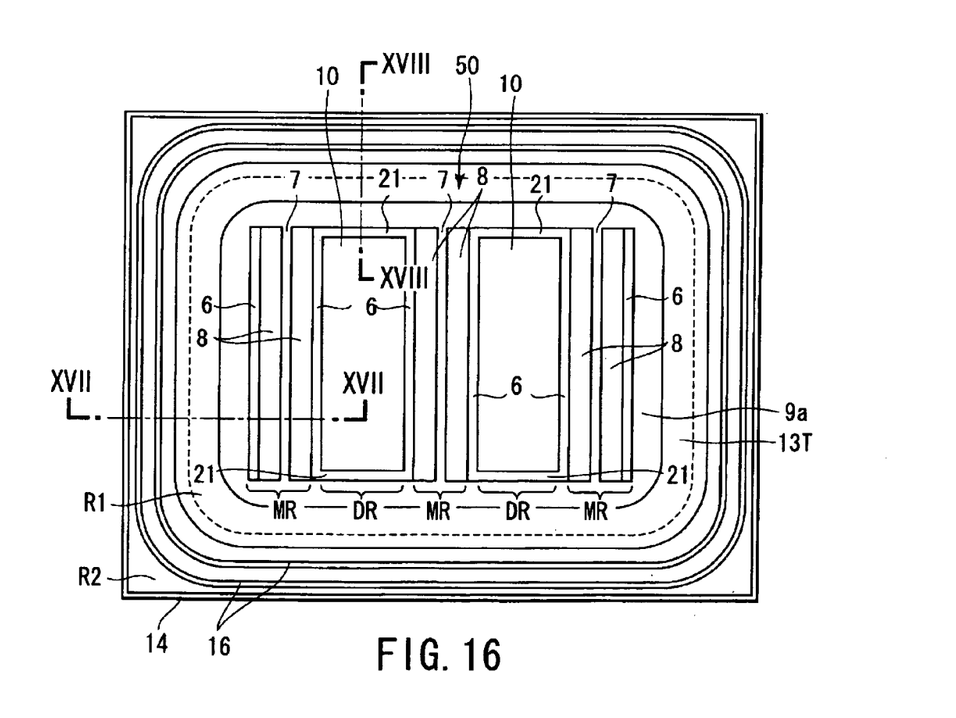
FIG. 16 is a plan view showing the layout of a power semiconductor device (IEGT chip) according to a seventh embodiment of the present invention.

FIG. 16 is a plan view showing the layout of a power semiconductor device (IEGT chip) according to a seventh embodiment of the present invention.

Figure 17:
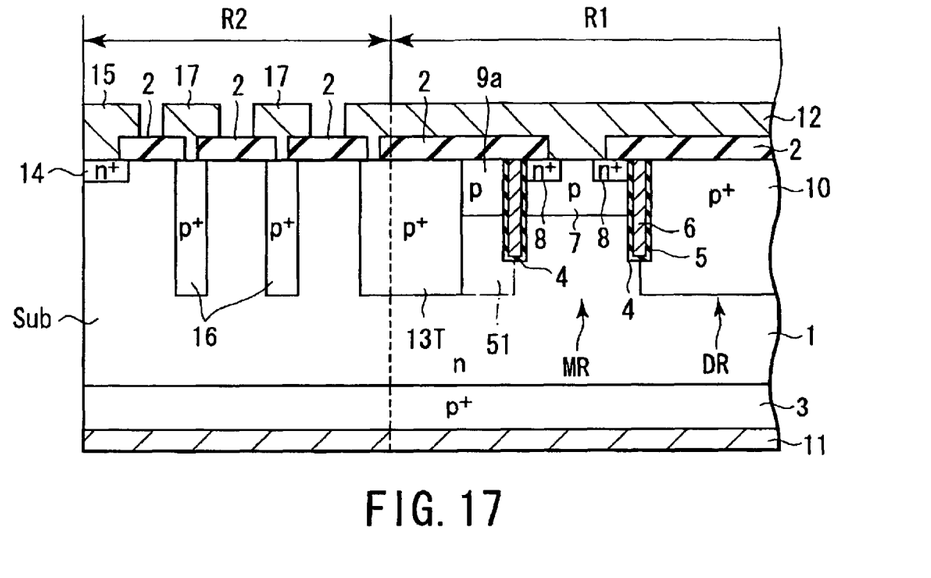
FIG. 17 is a sectional view taken along line XVII—XVII in FIG. 16, which corresponds to the periphery of the IEGT chip shown in FIG. 16.
Figure 18:
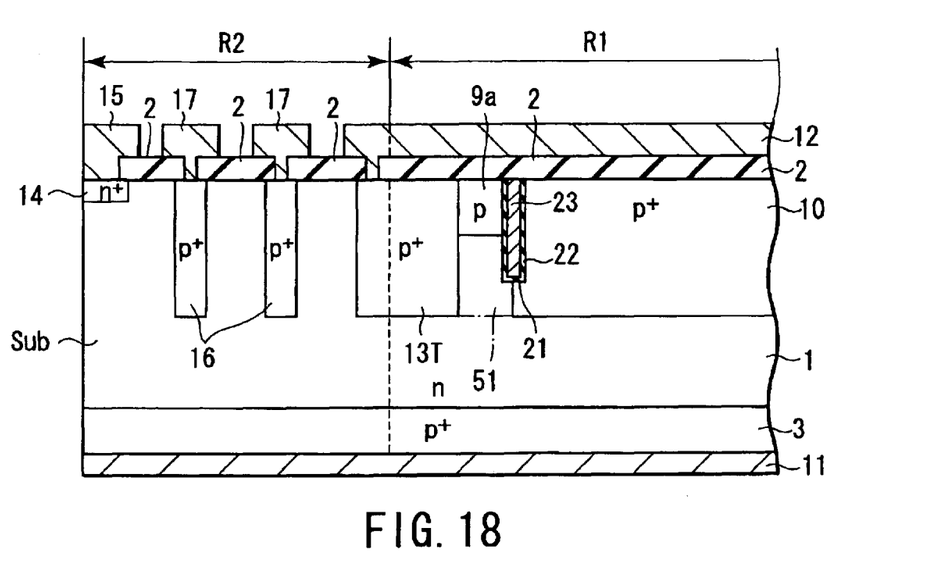
FIG. 18 is a sectional view taken along line XVIII—XVIII in FIG. 16, which corresponds to the periphery of the IEGT chip shown in FIG. 16.

FIGS. 17 and 18 are sectional views taken along lines XVII—XVII and XVIII—XVIII in FIG. 16, which correspond to the periphery of the IEGT chip shown in FIG. 16. As shown in FIGS. 16 to 18, this embodiment differs from the third embodiment shown in FIGS. 5 and 6, in that it does not include the surrounding trench 27 surrounding the main cells MR and dummy cells DR. In this embodiment with such a structure, a p-buffer layer 10 in each dummy cell DR is electrically isolated from an emitter electrode 12 in a manner described below.

In each dummy cell DR, the top surface of the p-buffer layer 10 is electrically isolated from the emitter electrode 12 by an insulating layer 2. Furthermore, the side surfaces of the p-buffer layer 10 are electrically isolated from the emitter electrode 12 by a partition structure 50 disposed in the top surface of a semiconductor substrate Sub. The partition structure 50 includes a first isolating section that electrically isolates the p-buffer layer 10 from a p-base layer 7, and a second isolating section that electrically isolates the p-buffer layer 10 from a p-guard ring layer 13T. In this embodiment, the first and second isolating sections are formed of a common wall (partition wall). The common wall is formed of a combination of dummy cell end trenches 21, as explained in the first embodiment, and an n-surrounding layer (partition layer) 51 disposed in the semiconductor substrate Sub at a position deeper than the dummy cell end trenches 21. The n-surrounding layer 51 is a portion integral with an n-base layer (i.e., the ground material of the semiconductor substrate Sub), which is present below the shallow p-surrounding buffer layer 9a surrounding the main cells MR and dummy cells DR.

In the IEGT according to this embodiment, the p-buffer layer 10 in each dummy cell DR is completely electrically isolated from the emitter electrode 12 by the dummy cell end trenches 21 formed integrally with the trenches 4, and the n-surrounding layer 51 surrounding the main cells MR and dummy cells DR. As a consequence, also in this embodiment, the injection efficiency of electrons from n-emitter layers 8 into an n-base layer 1 further improves, thereby resulting in a still lower ON-voltage, as in the first embodiment.

Figure 19:
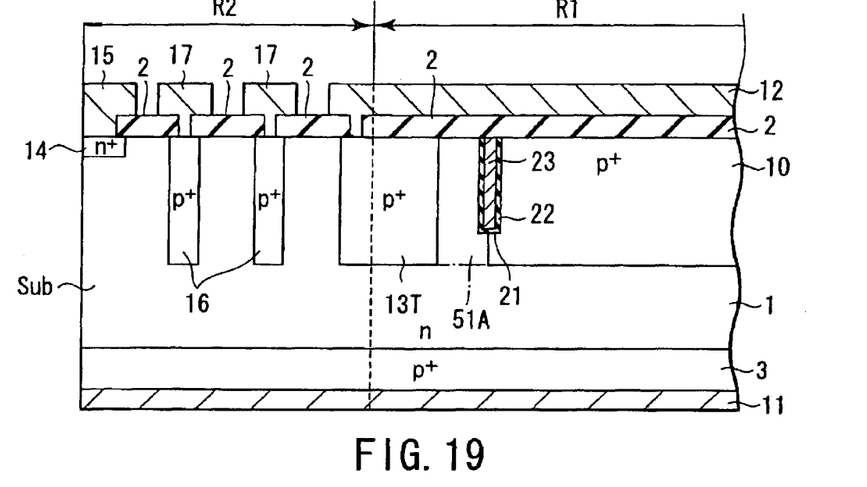
FIG. 19 is a sectional view showing the periphery of a power semiconductor device (IEGT chip) according to a modification of the seventh embodiment.

FIG. 19 is a sectional view showing the periphery of a power semiconductor device (IEGT chip) according to a modification of the seventh embodiment. As shown in FIG. 19, in this modification, the portion between the trenches 4 and 21 and p-guard ring layer 13T is not provided with the shallow p-surrounding buffer layer 9a, but with an n-surrounding layer (partition layer) 51A reaching the surface of the semiconductor substrate Sub. According to this modification, the p-buffer layer 10 in each dummy cell DR can be more reliably electrically isolated from the emitter electrode 12.

In the embodiments described above, an n-layer for partition employed in each of the partition structures 30, 35, 40, 45, and 50 is formed of a portion integral with an n-base layer (i.e., the ground material of an semiconductor substrate Sub). However, the n-layer for partition, especially an n-layer exposed on the surface of the semiconductor substrate Sub, may be independently formed by introducing an n-impurity from the surface of the substrate Sub.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:
   a semiconductor active layer;
   a first base layer of a first conductivity type disposed in the active layer;
   a plurality of trenches disposed in a surface of the active layer at intervals to partition a main cell and a dummy cell, and to reach the first base layer;
   a collector layer of a second conductivity type disposed on the first base layer, at a position remote from the trenches;
   a second base layer of the second conductivity type disposed in the main cell and on the first base layer;
   an emitter layer of the first conductivity type disposed on the second base layer;
   a buffer layer of the second conductivity type disposed in the dummy cell and on the first base layer;
   a gate electrode disposed in each trench to face, through a gate insulating film, a portion of the second base layer sandwiched between the first base layer and the emitter layer;
   a collector electrode disposed on the collector layer;
   an emitter electrode disposed on the second base layer and the emitter layer; and
   a partition structure disposed in the surface of the active layer to electrically isolate the buffer layer from the emitter electrode,
   wherein the partition structure comprises dummy cell end walls, which bridge ends of the trenches one on either end of the dummy cell and cooperate with the trenches to surround the dummy cell.

2. The device according to claim 1, wherein the dummy cell end walls comprise a partition trench disposed in the surface of the active layer.

3. The device according to claim 2, wherein the partition trench has a depth substantially the same as the trenches.

4. The device according to claim 2, further comprising a conductive layer disposed in the partition trench and wrapped in an insulating film, wherein the conductive layer is electrically connected to the gate electrode.

5. The device according to claim 2, wherein the partition trench is filled with an insulating layer.

6. The device according to claim 1, wherein the dummy cell end walls comprise a partition layer of the first conductivity type disposed in the surface of the active layer.

7. The device according to claim 1, wherein the dummy cell end walls comprise a combination of a partition trench and a partition layer of the first conductivity type, the partition trench being disposed in the surface of the active layer, and the partition layer of the first conductivity type being disposed in the active layer at a position deeper than the partition trench.

8. A power semiconductor device comprising:
   a semiconductor active layer;
   a first base layer of a first conductivity type disposed in the active layer;
   a plurality of trenches disposed in a surface of the active layer at intervals to partition a main cell and a dummy cell, and to reach the first base layer;
   a collector layer of a second conductivity type disposed on the first base layer, at a position remote from the trenches;
   a second base layer of the second conductivity type disposed in the main cell and on the first base layer;
   an emitter layer of the first conductivity type disposed on the second base layer;
   a buffer layer of the second conductivity type disposed in the dummy cell and on the first base layer;
   a gate electrode disposed in each trench to face, through a gate insulating film, a portion of the second base layer sandwiched between the first base layer and the emitter layer;
   a collector electrode disposed on the collector layer;
   an emitter electrode disposed on the second base layer and the emitter layer; and
   a partition structure disposed in the surface of the active layer to electrically isolate the buffer layer from the emitter electrode, wherein the partition structure comprises main cell end walls, which bridge ends of the trenches one on either end of the main cell and cooperate with the trenches surround the main cell.

9. The device according to claim 8, wherein the main cell end walls comprise a partition trench disposed in the surface of the active layer.

10. The device according to claim 9, wherein the partition trench has a depth substantially the same as the trenches.

11. The device according to claim 9, further comprising a conductive layer disposed in the partition trench and wrapped in an insulating film, wherein the conductive layer is electrically connected to the gate electrode.

12. The device according to claim 9, wherein the partition trench is filled with an insulating layer.

13. The device according to claim 8, wherein the main cell end walls comprise a partition layer of the first conductivity type disposed in the surface of the active layer.

14. The device according to claim 8, wherein the main cell end walls comprise a combination of a partition trench and a partition layer of the first conductivity type, the partition trench being disposed in the surface of the active layer, and the partition layer of the first conductivity type being disposed in the active layer at a position deeper than the partition trench.

15. A power semiconductor device comprising:
a semiconductor active layer;
a first base layer of a first conductivity type disposed in the active layer;
a plurality of trenches disposed in a surface of the active layer at intervals to partition a main cell and a dummy cell, and to reach the first base layer;
a collector layer of a second conductivity type disposed on the first base layer, at a position remote from the trenches;
a second base layer of the second conductivity type disposed in the main cell and on the first base layer;
an emitter layer of the first conductivity type disposed on the second base layer;
a buffer layer of the second conductivity type disposed in the dummy cell and on the first base layer;
a gate electrode disposed in each trench to face, through a gate insulating film, a portion of the second base layer sandwiched between the first base layer and the emitter layer;
a collector electrode disposed on the collector layer;
an emitter electrode disposed on the second base layer and the emitter layer; and
a partition structure disposed in the surface of the active layer to electrically isolate the buffer layer from the emitter electrode,
wherein the partition structure comprises a partition wall including a partition layer of the first conductivity type disposed in the surface of the active layer.

16. The device according to claim 15, wherein the partition layer comprises a portion integral with the first base layer.

17. The device according to claim 15, wherein the partition wall is formed of a combination of a partition trench and the partition layer of the first conductivity type, the partition trench being disposed in the surface of the active layer, and the partition layer of the first conductivity type being disposed in the active layer at a position deeper than the partition trench.

18. The device according to claim 17, wherein the partition trench has a depth substantially the same as the trenches.

19. The device according to claim 17, further comprising a conductive layer disposed in the partition trench and wrapped in an insulating film, wherein the conductive layer is electrically connected to the gate electrode.

20. The device according to claim 17, wherein the partition trench is filled with an insulating layer.

* * * * *